United States Patent
Sohn et al.

(10) Patent No.: US 6,826,088 B2
(45) Date of Patent: Nov. 30, 2004

(54) METHOD AND INTEGRATED CIRCUIT CAPABLE OF READING AND WRITING DATA SIMULTANEOUSLY

(75) Inventors: Kyo-Min Sohn, Sungnam (KR); Young-Ho Suh, Suwon (JP)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/692,997

(22) Filed: Oct. 24, 2003

(65) Prior Publication Data

US 2004/0141399 A1 Jul. 22, 2004

Related U.S. Application Data

(60) Provisional application No. 60/426,575, filed on Nov. 14, 2002.

(30) Foreign Application Priority Data

Oct. 26, 2002 (KR) .................................... 10-2002-65682

(51) Int. Cl.[7] ................................................. G11C 7/00
(52) U.S. Cl. ............................ 365/189.04; 365/230.03; 365/189.06; 365/233; 365/230.06
(58) Field of Search ........................ 365/230.03, 189.05, 365/189.04, 189.07, 233, 230.06

(56) References Cited

U.S. PATENT DOCUMENTS 5,553,255 A * 9/1996 Jain et al. .................... 712/235
6,222,752 B1 * 4/2001 Kumar et al. .................. 365/49
6,597,620 B1 * 7/2003 McMinn ...................... 365/226

* cited by examiner

Primary Examiner—Andrew Q. Tran
(74) Attorney, Agent, or Firm—Marger Johnson & McCollom, P.C.

(57) ABSTRACT

An integrated circuit and a method of reading and writing data at the same time are provided. The integrated circuit has separate input and output ports and a write address and a read address are input during a period of a clock signal. The circuit includes memory blocks that respectively include a plurality of sub memory blocks, cache memory blocks that respectively correspond to the memory blocks, and a tag memory control unit. The tag memory control unit controls reading data from and writing data to the memory blocks and the cache memory blocks in response to the write address or the read address. In particular, reads of the data from or writes of the data to the memory block and the cache memory block at the same time are performed if an upper address of the read address and an upper address of the write address are identical to each other. Since data can be separately read from and written to a memory block or a cache memory block at the same time during a period of a clock signal, an operational frequency of the clock signal can be increased.

32 Claims, 8 Drawing Sheets

METHOD AND INTEGRATED CIRCUIT CAPABLE OF READING AND WRITING DATA SIMULTANEOUSLY

This application claims priority to U.S. Provisional Patent Application Ser. No. 60/426,575 filed Nov. 14, 2002, which is incorporated by reference in its entirety. This application also claims priority to Korean Patent Application 2002-65682, filed Oct. 26, 2002, which is incorporated by reference in its entirety.

BACKGROUND OF THE INVENTION

1. Field of the Invention

The present invention relates to an integrated circuit, and more particularly to an integrated circuit capable of reading and writing data simultaneously with a separate input and output port and a method of simultaneously reading and writing data.

2. Description of the Related Art

A general synchronous RAM can transmit either read data or write data in synchronization with each pulse of a clock signal.

A double data rate RAM increases the data transmission rate to twice the existing transmission rate by transmitting data at every rising edge and falling edge of a clock signal. In a general memory device, however, data is input and output through one pin. When data is input and output through a common input and output (I/O) port, data input or output cannot be independently controlled. Thus, the frequencies of data input or output are limited.

Because the bandwidth of a memory device has become increasingly important, a memory device having a separate I/O port has been produced. That is, input pins and output pins are separated so that data input and output can be independently controlled. Since a memory device having separate I/O ports can receive a read command, a read address, a write command, a write address, and write data in one period of a clock signal, the operational frequency can increase.

In order to read or write data within one period of a clock signal, however, a memory device having separate I/O has to access a memory cell two times.

That is, since a word line for reading and writing data is activated two times within a period of the clock signal, a clock signal frequency is limited by the time necessary for activating the word line.

FIG. 1 is a timing diagram for explaining an operation of a memory device having separate I/O ports.

Since a relation between an address and a word line and latency of input data and output data may be changed according to a circuit configuration of a memory device, they will not be considered in FIG. 1.

Referring to FIG. 1, a write address and a read address are both input in the same period of a clock signal CLK. Addresses A0, A2, A4, and A6, which are input at a rising edge of the clock signal CLK, are the read addresses RADD, and addresses A1, A3, A5, and A7, which are input at a falling edge of the clock signal CLK, are the write addresses WADD.

RES denotes a read selection signal used to select the read address RADD, and WES denotes a write selection signal used to select the write address WADD.

A word line AWL0 is activated by a read address RADD A0, and data Q0 is output in response to the word line AWL0. In addition, after a word line AWL1 is activated in response to a write address WADD A1, input data D1 is input.

Therefore, the length of a period of the clock signal CLK is limited due to activations of the word line AWL0 for data read and the word line AWL1 for data write. That is, since it is necessary to sequentially access memory cells having different addresses during a period of the clock signal CLK, it is difficult to reduce the period of the clock signal CLK.

SUMMARY OF THE INVENTION

The present invention provides an integrated circuit that is capable of increasing an operational frequency of a clock signal by sequentially reading data from and writing data to a memory cell within a period of the clock signal.

The present invention also provides a method of increasing an operational frequency of a clock signal by sequentially reading data from and writing data to a memory cell within a period of the clock signal.

According to one aspect of the present invention, there is provided an integrated circuit that has separate input and output ports and to which a write address and a read address are input during a period of a clock signal, the integrated circuit comprising memory blocks that respectively include a plurality of sub memory blocks, cache memory blocks that respectively correspond to the memory blocks, and a tag memory control unit that reads data from or writes data to the memory blocks and the cache memory blocks in response to the write address or the read address, wherein the tag memory control unit reads data from or writes data to a memory block and a cache memory block at the same time if an upper address of the read address and an upper address of the write address are identical to each other.

Two different sub memory blocks respectively corresponding to the write address and the read address are decoded.

The integrated circuit further comprises a write address decoding path and a read address decoding path that are separated from each other, and the sub memory blocks are connected to the write address decoding path and the read address decoding path.

Among the sub memory blocks in the memory block, memory cells having the same upper address correspond to one memory cell of the cache memory block. The size of the cache memory block is equal to or is larger than the size of the sub memory block.

The tag memory control unit stores validity determination information used to determine whether a cache memory address, which indicates an address of the sub memory block corresponding to the cache memory block and the data stored therein, and the cache memory block are valid or not.

When data is read and written simultaneously, the tag memory unit directs simultaneous data operations based on the upper read and write addresses. In one case, the upper read and write addresses are identical, but both differ from the cache memory address. In this case, the tag memory control unit reads data from the memory block corresponding to the read address and writes data to the cache memory block.

In a second case, the upper read and write addresses are identical, but either the write address or the read address is identical to the cache memory address. In this case, operation corresponding to the address that is identical to the cache memory address is performed on the cache memory block, and the other operation is performed on the memory block. In a third case, if the read address, write address, and cache memory address are all identical, data is read from the cache memory block and written to the memory block at the same time.

In a fourth case, the upper read address and upper write address are not identical, but either the write address or the read address is identical to the cache memory address. In this case, an operation corresponding to the address that is identical to the cache memory is performed on the cache memory block, and the operation corresponding to the other address that is not identical to the cache memory address is performed on the memory block.

The data is input or output at a single data rate (SDR) or a double data rate (DDR).

According to another aspect of the present invention, there is provided an integrated circuit that has separate input and output ports, the integrated circuit comprising memory blocks that respectively include a plurality of sub memory blocks, a plurality of cache memory blocks that respectively correspond to the memory blocks and to which data are read or written in response to a cache control signal, a plurality of decoding units that respectively correspond to the memory blocks and generate decoding signals used to control the sub memory blocks in response to a write address, a read address, or a decoding control signal, a tag memory control unit which receives a write selection signal or a read selection signal, receives the write address or the read address, and generates the cache control signal or the decoding control signal to read or write data based on whether the write address and the read address are identical to each other during a period of a clock signal.

The decoding units include a plurality of decoding circuits that correspond to the sub memory blocks. The decoding circuits are connected to a write address decoding path and a read address decoding path that are separated from each other, and the sub memory blocks are respectively connected to the write address decoding path and the read address decoding path.

According to another aspect of the present invention, there is provided a method of reading and writing data in an integrated circuit that includes separate input and output ports, a plurality of memory blocks respectively having a plurality of sub memory blocks, and cache memory blocks corresponding to the memory blocks and to which a write address and a read address are input during a period of a clock signal, the method comprising (a) determining whether both the write address and the read address are input or either of the write address or the read address is input during a period of a clock signal, (b) if both the write address and the read address are input, determining whether an upper address of the write address is identical to an upper address of the read address, (c) if the upper address of the write address is identical to the upper address of the read address, determining whether the write address and the read address are identical to a cache memory address, and (d) if neither the write address nor the read address is identical to a cache memory address, data are read from a memory block corresponding to the read address and are written to the cache memory block.

Step (d) further comprises (d1) determining whether data stored in the cache memory block is valid (d2) reading data from the memory block corresponding to the read address and writing data to the cache memory block if data stored in the cache memory block is not valid (d3) updating information on the data written to the cache memory block, (d4) if data stored in the cache memory block is valid reading-data from the memory block corresponding the read address and writing valid data stored in the cache memory block to the memory block, and (d5) writing data to the cache memory block and updating information on the data written to the cache memory block.

The cache memory address indicates an address of a sub memory block corresponding to the cache memory block.

Step (c) further comprises (c1) if either of the write address or the read address is identical to the cache memory address, performing on the cache memory block an operation corresponding to the address that is identical to the cache memory address and performing on the memory block an operation corresponding to the other address that is not identical to the cache memory address, and (c2) if both the write address and the read address are identical to the cache memory address, reading data from the cache memory block, writing data to the memory block, and updating information on the data written to the memory block.

Step (b) further comprises (b1) if the upper address of the write address is not identical to the upper address of the read address, determining whether the write address and the read address are identical to the cache memory address, (b2) if either of the write address or the read address is identical to the cache memory address, performing on the cache memory block an operation corresponding to the address that is identical to the cache memory address and performing an operation on the memory block corresponding to the other address that is not identical to the cache memory address, (b3) if both the write address and the read address are identical to the cache memory address, reading data from the cache memory block, writing data to the memory block, and updating information on the data written to the memory block, and (b4) if neither the write address nor the read address is identical to the cache memory address, performing a data write operation and a data read operation on two different sub memory blocks corresponding to the write address and the read address of the selected memory block.

Step (a) further comprises (a1) if either of the write address or the read address is input, determining whether the input address is identical to the cache memory address, (a2) if the input address is identical to the cache memory address, performing on the cache memory block an operation corresponding to the input address that is identical to the cache memory address, and (a3) if the input address is not identical to the cache memory address, performing on the memory block an operation corresponding to the input address that is not identical to the cache memory address.

Among different sub memory blocks of the memory block, memory cells having the same lower address correspond to one memory cell of the cache memory block. The size of the cache memory block is equal to or is larger than the size of a sub memory block.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
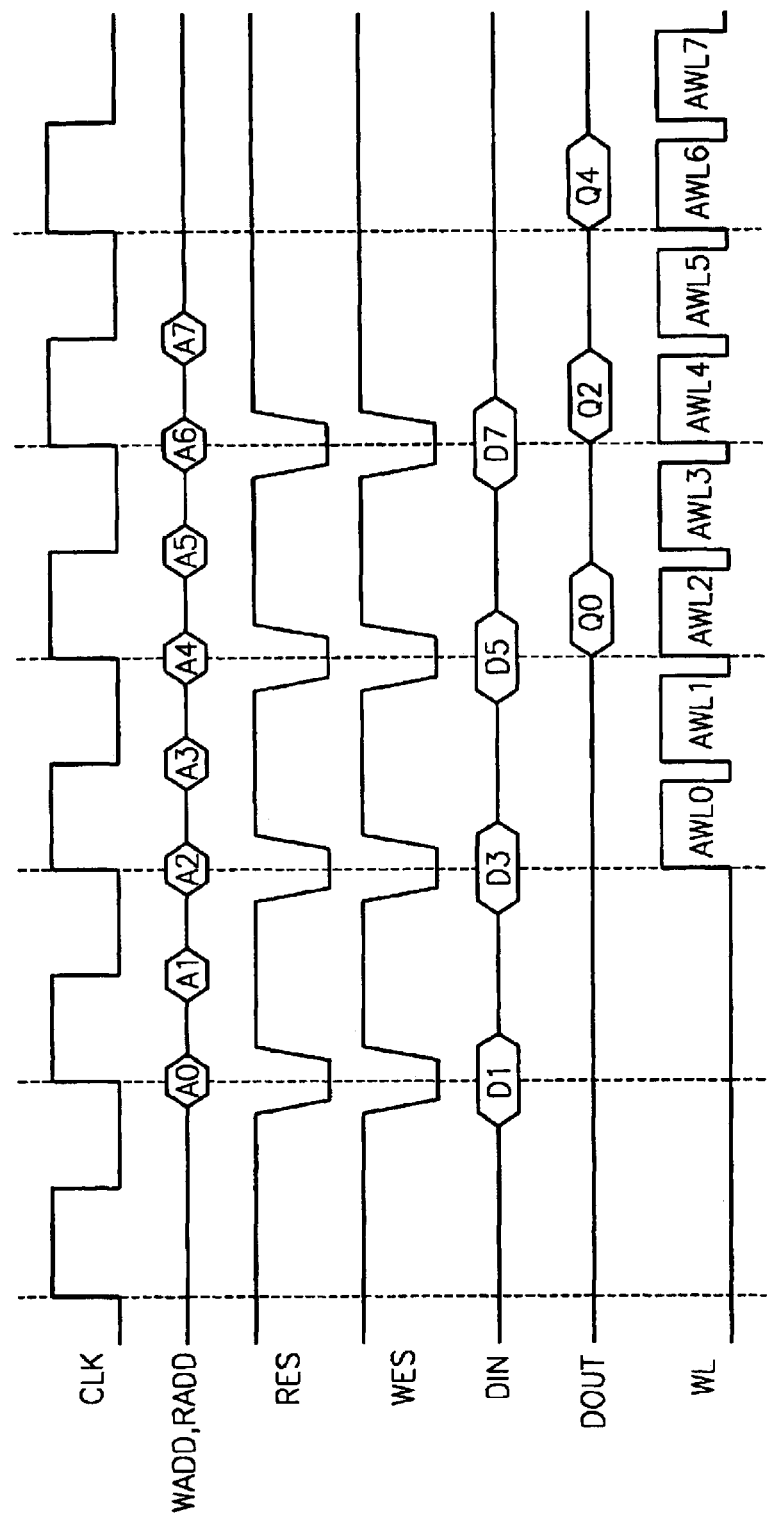
FIG. 1 is a timing diagram for explaining an operation of a memory device having separate input/output ports.

The present invention now will be described more fully with reference to the accompanying drawings, in which preferred embodiments of the invention are shown. In the drawings, like reference numerals are used to refer to like elements throughout.

Figure 2:
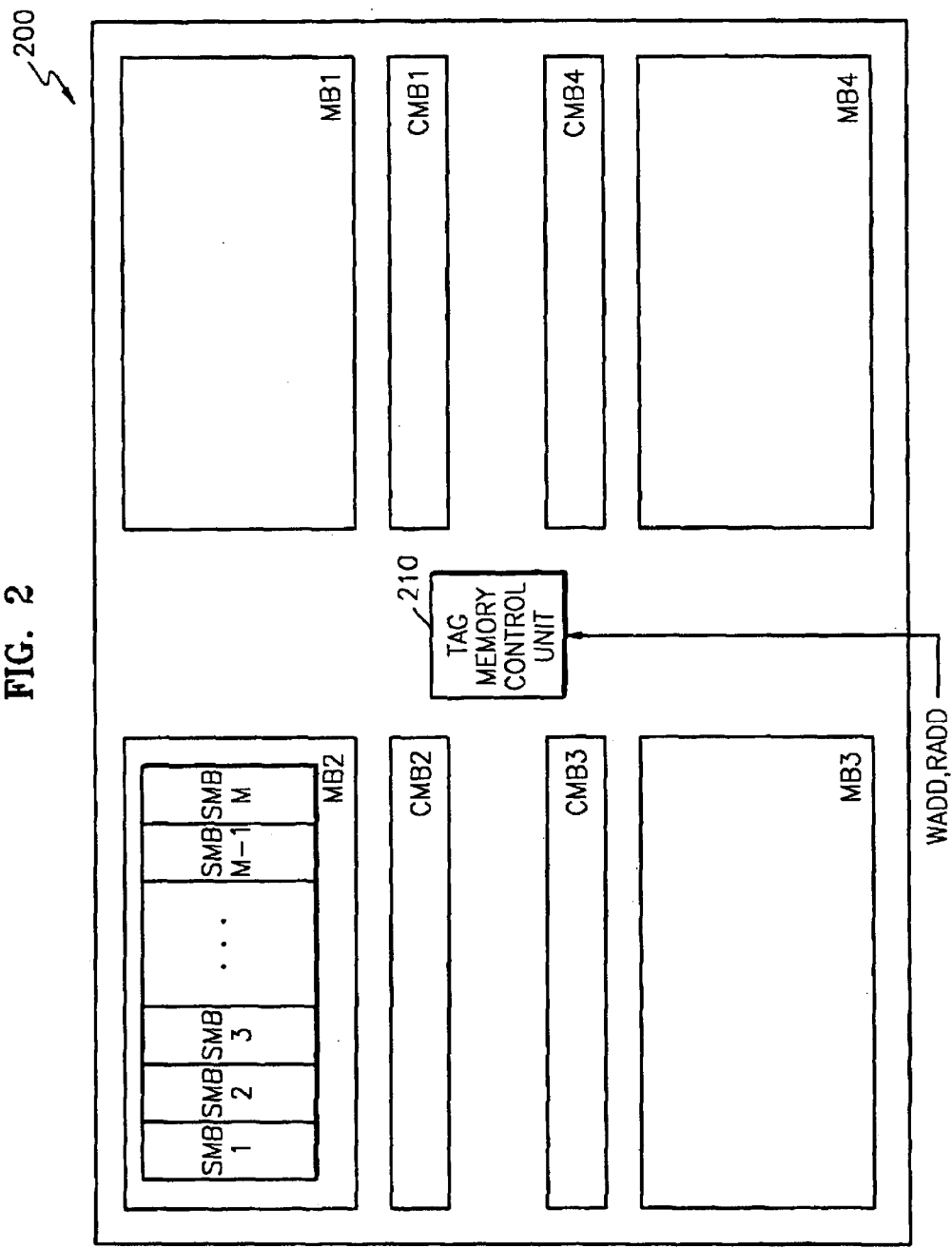
FIG. 2 is a block diagram of an integrated circuit according to a first embodiment of the present invention.

FIG. 2 is a block diagram of an integrated circuit 200 according to a first embodiment of the present invention.

Referring to FIG. 2, the integrated circuit 200 includes: memory blocks MB1, MB2, MB3, and MB4, each of which has a plurality of sub memory blocks SMB 1 through SMB M; cache memory blocks CMB1, CMB2, CMB3, and CMB4 corresponding to the memory blocks MB1, MB2, MB3, and MB4; and a tag memory control unit 210. The integrated circuit 200 of FIG. 2 has separate input/output ports, and a write address WADD and a read address RADD are input to the integrated circuit 200 during a period of a clock signal.

The memory blocks MB1, MB2, MB3, and MB4 all have the same configuration, and the cache memory blocks CMB1, CMB2, CMB3, and CMB4 all have the same configuration. Thus, hereinafter, only a memory block MB2 and a cache memory block CMB2 will be described.

The write address WADD and the read address RADD are respectively composed of an upper address and a lower address. The upper address is used to select one of the plurality of sub memory blocks.

Fundamentally, the present invention aims at reducing the period of a clock signal by simultaneously reading and writing data respectively in a memory block and a cache memory block if the write address WADD and the read address RADD are identical to each other.

That is, if the write address WADD and the read address RADD are identical to each other, it is necessary to access the same sub memory block, e.g., SMB2, of the same memory block, e.g., MB2, data is read in the sub memory block SMB2 and is written in the cache memory block CMB2 corresponding to the sub memory block SMB2.

If data is written in the memory block MB2, the data is read in the cache memory block CMB2 corresponding to the memory block MB2. Thus, data can be read and written simultaneously while reducing the period of the clock signal.

Therefore, memory cells of the sub memory blocks SMB 1 through SMB M in the memory block MB2, which have the same lower address, have to correspond to one memory cell of the cache memory block CMB2. In addition, since data may be read and written in the same sub memory block, the size of the cache memory block has to be equal to or bigger than the size of a sub memory block.

The tag memory controlling unit 210 reads data stored in or writes data to the memory blocks MB1, MB2, MB3, and MB4 and the cache memory blocks CMB1, CMB2, CMB3, and CMB4.

If the write address WADD and the read address RADD are identical to each other, data is read in one sub memory block of the memory block MB2, and is written in the cache memory block CMB2, and an address of the sub memory block of the memory block MB2 where data written in the cache memory block CMB2 is supposed to be stored, is stored as a cache memory address to the tag memory controlling unit 210.

That is, the cache memory address is an upper address that is used to select a sub memory block where data stored in the cache memory block CMB2 is supposed to be stored. The cache memory address stored in the tag memory control unit 210 is accessed by using the lower address of the input addresses, and the accessed cache memory address is compared with the upper address of the input addresses.

If the next write address WADD and the next read address RADD are identical to each other and the next write address WADD and the next read address RADD are identical to the previous write address WADD and the previous read address RADD, it is necessary to perform a data write operation in the cache memory block CMB2. In this case, it has to be determined whether data already written in the cache memory block CMB2 is valid or not.

If the data already written in the cache memory block CMB2 is valid, it is read out and written in a sub memory block corresponding to the memory block MB2, and data corresponding to the next write address WADD is written in the cache memory block CMB2. Validity determination information, which indicates the validity of data stored in the cache memory block CMB2, is stored in the tag memory control unit 210.

If the write address WADD and the read address RADD are different from each other, two different sub memory blocks, which respectively correspond to the write address WADD and the read address RADD, are decoded.

Therefore, the integrated circuit 200 has to have a write address decoding path (not shown) and a read address decoding path (not shown) that are separated from each other. In addition, the sub memory blocks SMB1 through SMB M have to be respectively connected to the write address decoding path and the read address decoding path.

Data is input or output at a single data rate (SDR) or a double data rate (DDR) through an input pin and an output pin.

The tag memory control unit 210 controls the memory block MB2 and the cache memory block CMB2 and performs data read and write operations. The operations of the tag memory control unit 210 will be described with reference to FIGS. 3 and 4.

Figure 3:
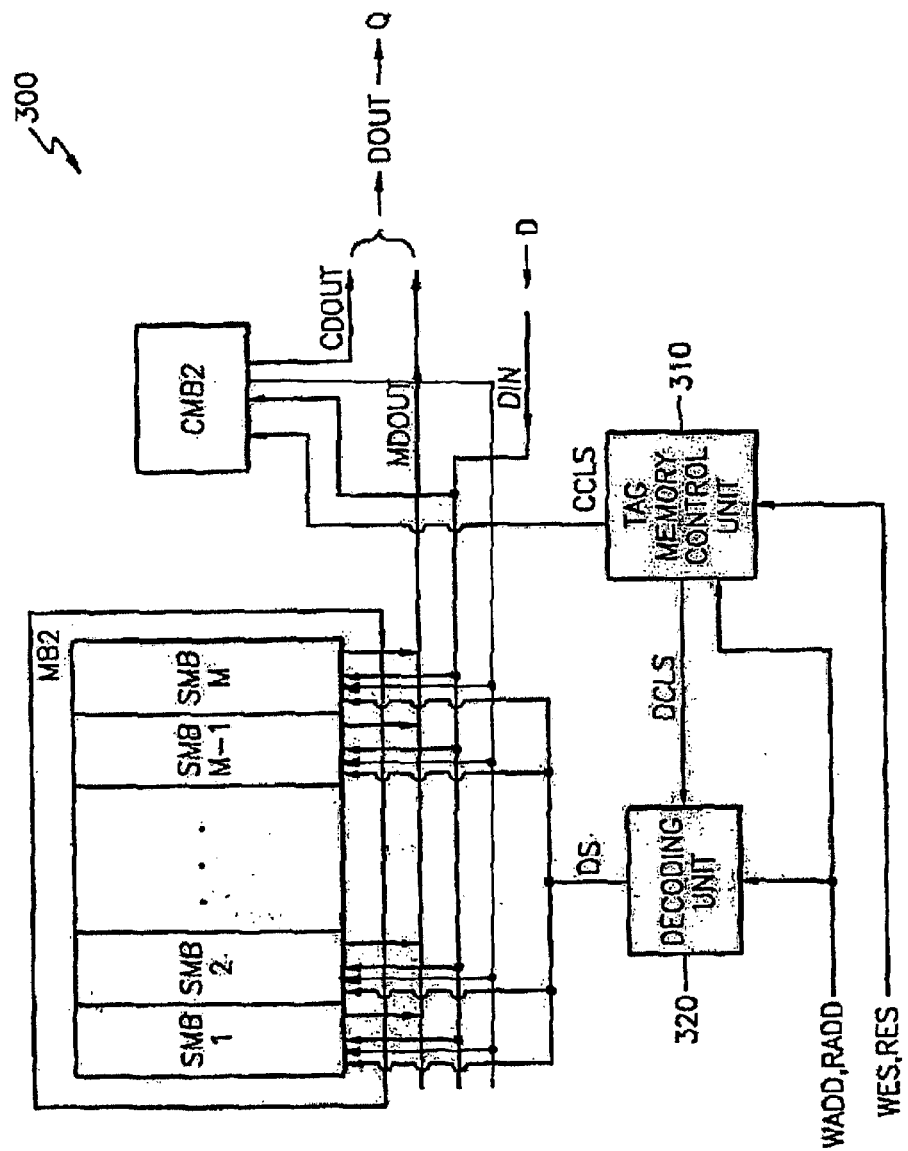
FIG. 3 is a block diagram of an integrated circuit according to a second embodiment of the present invention.

FIG. 3 is a block diagram showing an integrated circuit 300 according to a second embodiment of the present invention.

The integrated circuit 300 includes memory blocks that respectively have a plurality of sub memory blocks SMB 1 through SMB M, cache memory blocks, decoding units, and a tag memory control unit 310.

The cache memory blocks respectively correspond to the memory blocks, and data is read from or written to the cache memory blocks in response to a predetermined cache control signal CCLS. The decoding units respectively correspond to the memory blocks and generate decoding signals DS, which control the sub memory blocks SMB 1 through SMB M, in response to a predetermined decoding control signal DCLS.

For simplicity, FIG. 3 shows only one memory block MB2 of the plurality of memory blocks, one decoding unit 320 of the plurality of decoding units, and one cache memory block CMB2 of the plurality of cache memory blocks. Operations of the integrated circuit 300 according to the second embodiment will be described with reference to the memory block MB2, the cache memory block CMB2, the decoding unit 320, and the tag memory control unit 310.

The tag memory control unit 310 receives a write selection signal WES or a read selection signal RES, receives a write address WADD or a read address RADD, and generates the cache control signal CCLS or a decoding control signal DCLS to write and read data at the same time if the write address WADD and the read address RADD input during a period of a clock signal are identical to each other. Though not shown in the figures, the read selection signal RES and the write selection signal WES can be applied to the memory block MB2 and the cache memory block CMB2.

The decoding units include a plurality of decoding circuits (not shown) respectively corresponding to the sub memory blocks SMB 1 through SMB M because two different sub memory blocks respectively corresponding to the input write address WADD and the input read address RADD have to be decoded if the input write address WADD and the input read address RADD are different from each other.

Therefore, the decoding circuits are connected to the write address decoding path (not shown) and the read address decoding path (not shown), which are separated from each other, and the sub memory blocks SMB 1 through SMB M are connected to the write address decoding path and the read address decoding path.

Figure 4:
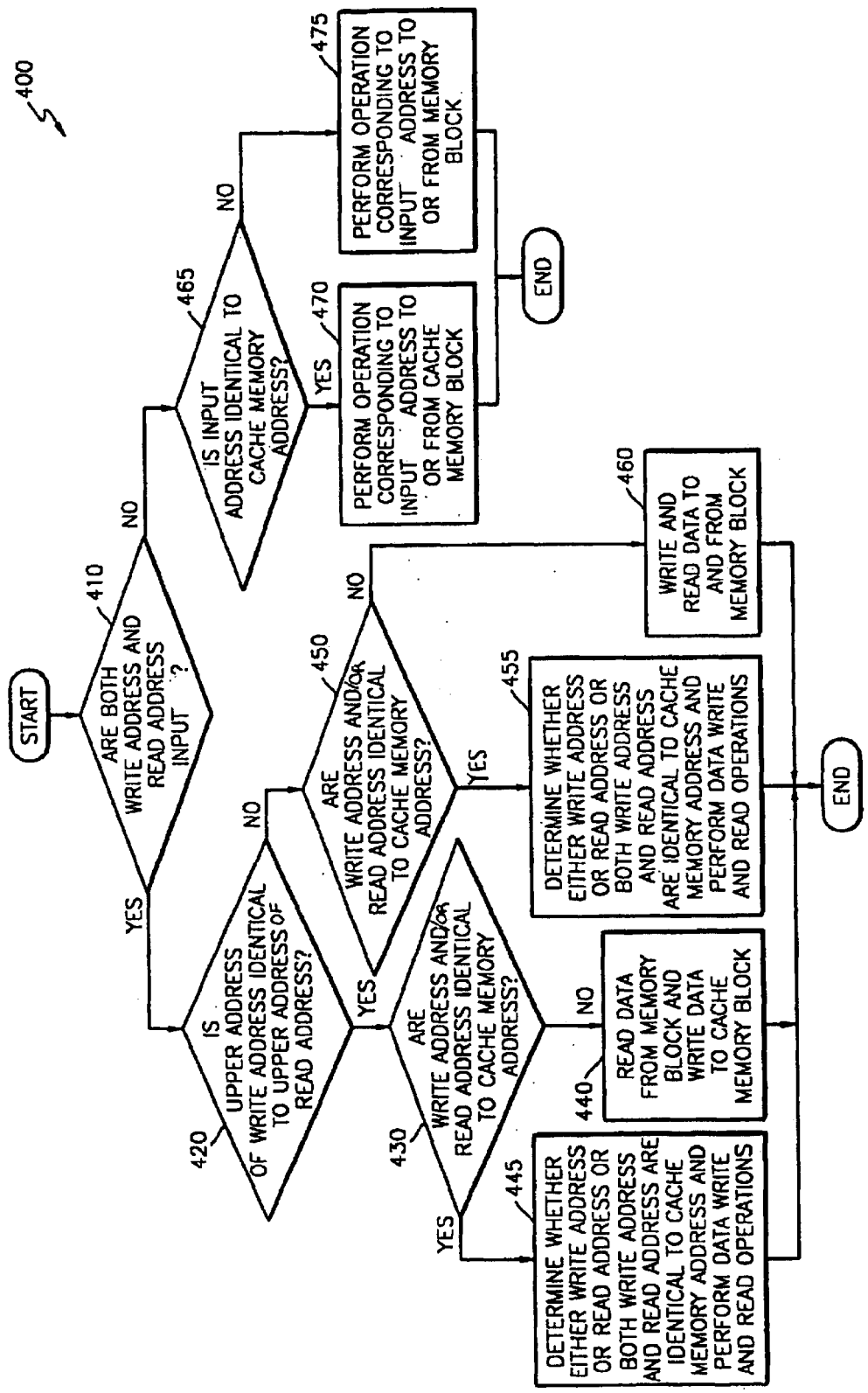
FIG. 4 is a flowchart showing a method of simultaneously reading and writing data according to a first embodiment of the present invention.
Figure 5:
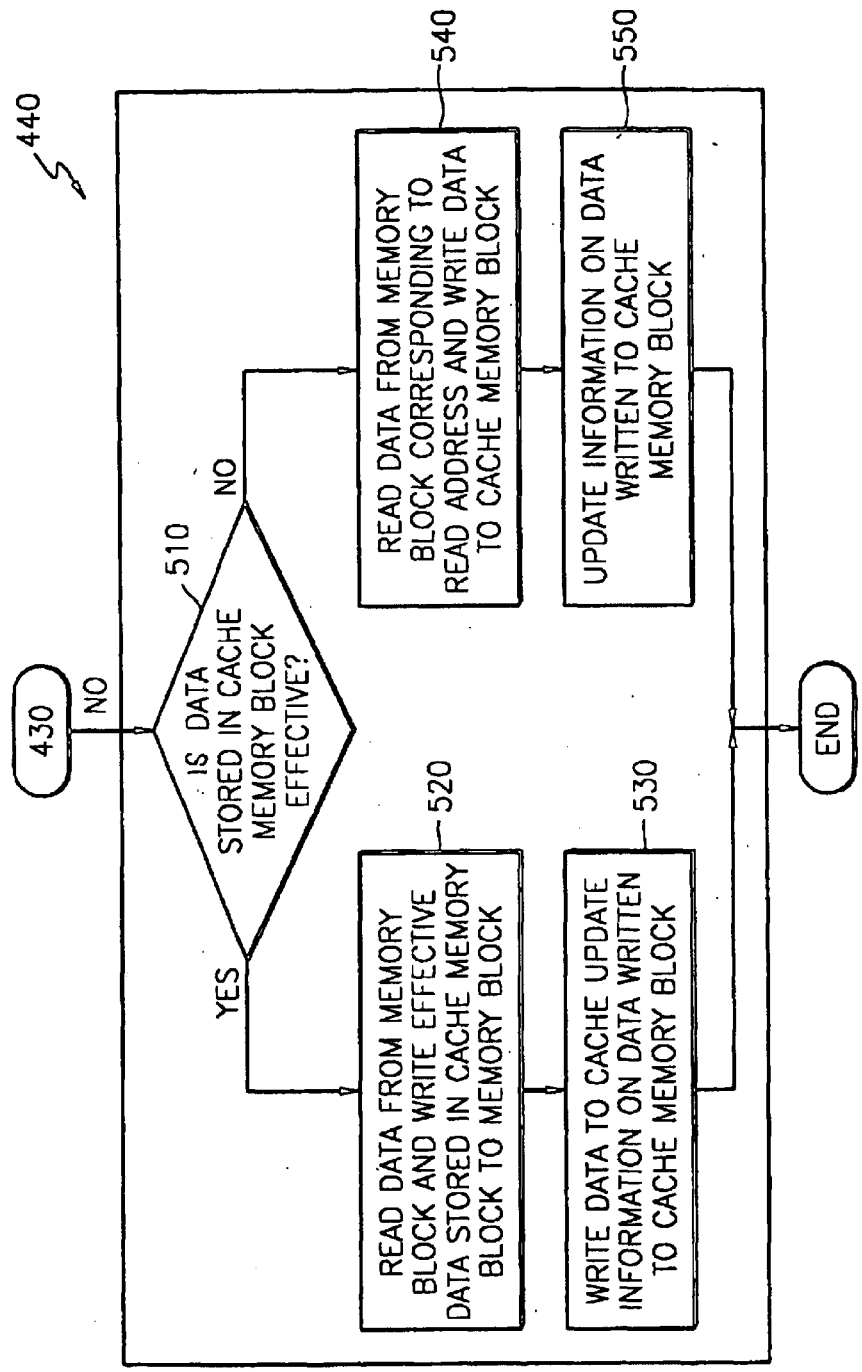
FIG. 5 is a flowchart for explaining step 440 of FIG. 4.
Figure 6:
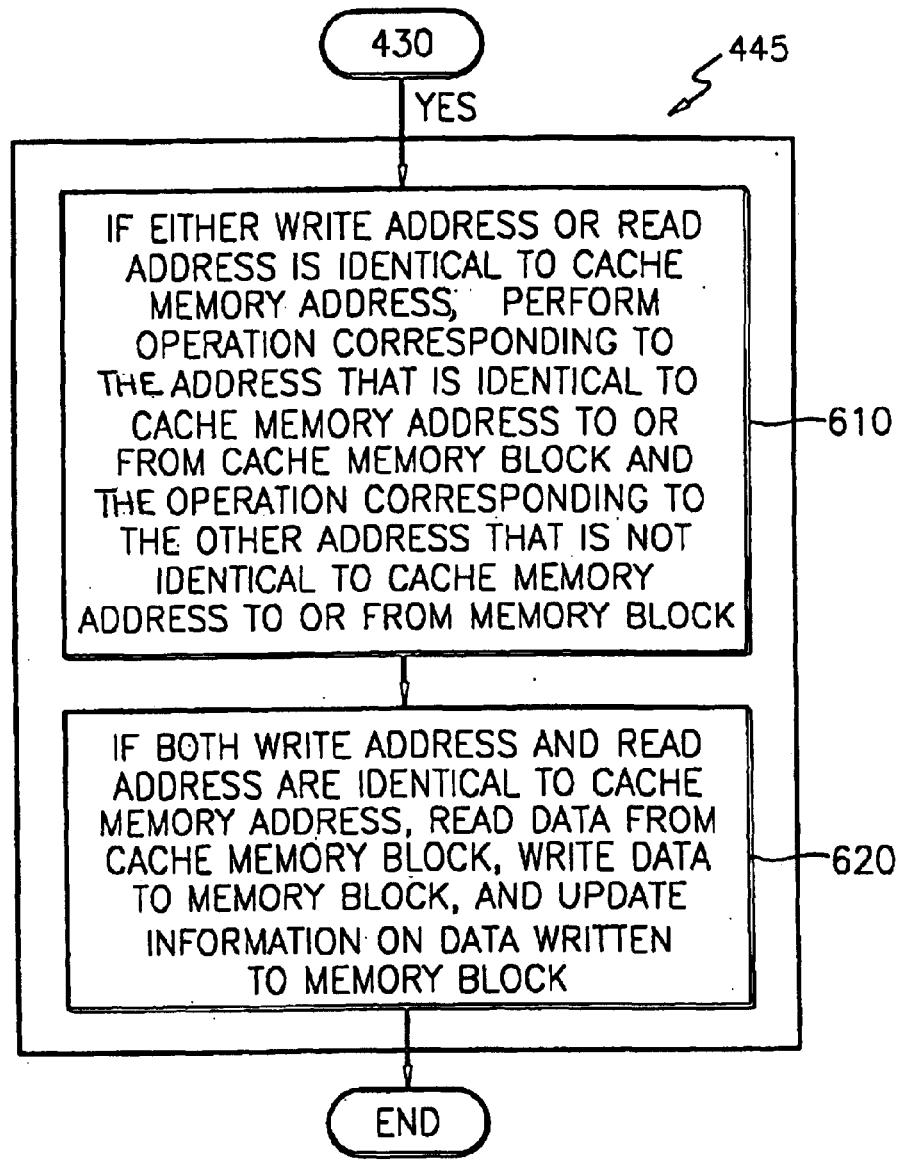
FIG. 6 is a flowchart for explaining step 445 of FIG. 4.
Figure 7:
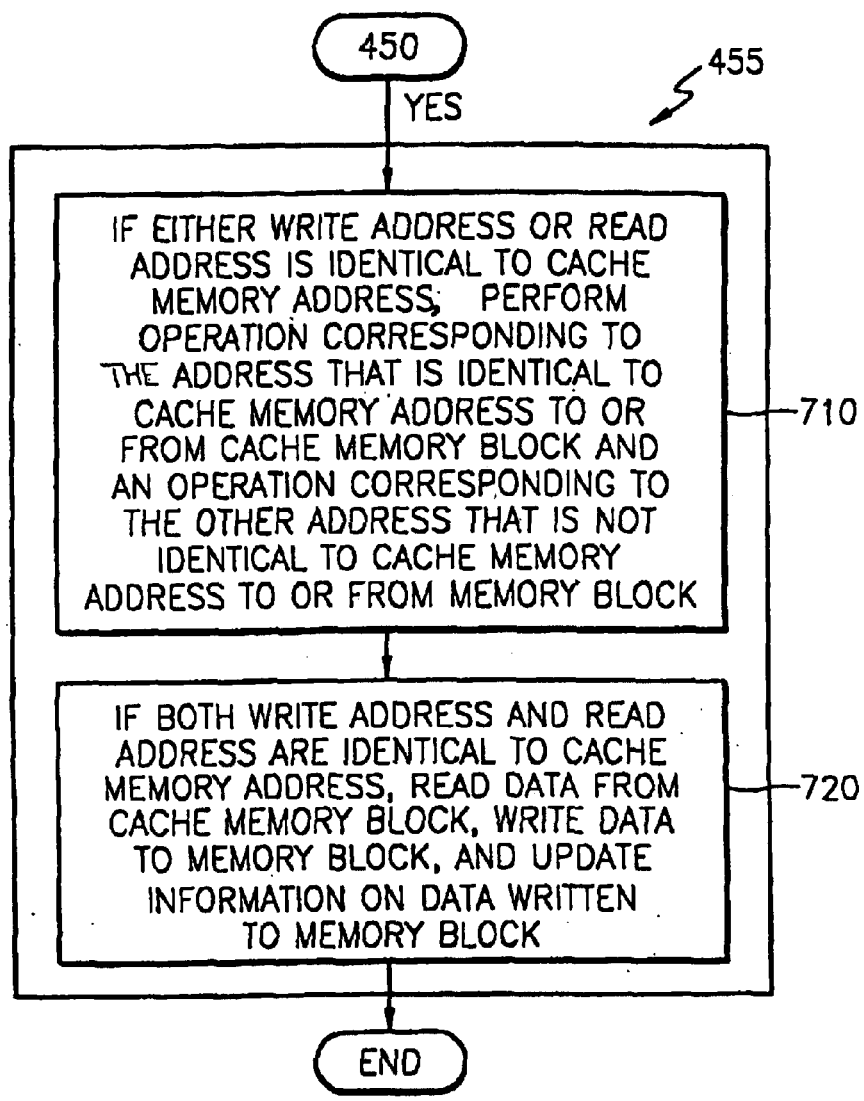
FIG. 7 is a flowchart for explaining step 455 of FIG. 4.

FIG. 4 is a flowchart showing a method of simultaneously reading and writing data according to an embodiment of the present invention. FIG. 5 is a flowchart for explaining step 440 of FIG. 4, FIG. 6 is a flowchart for explaining step 445 of FIG. 4, and FIG. 7 is a flowchart for explaining step 455 of FIG. 4.

Hereinafter, an integrated circuit that simultaneously reads and writes data and a method of simultaneously reading and writing data will be described with reference to FIGS. 2 through 7.

In step 410, it is determined whether both a write address and a read address are input during a clock signal period. The determination can be performed by the write selection signal WES and the read selection signal RES of FIG. 3.

Here, the write address WADD is input when the write selection signal WES is at low level, and the read address RADD is input when the read selection signal RES is at low level. However, the write address WADD and the read address RADD may be input when the write selection signal WES and the read selection signal RES are at a high level.

The tag memory control unit 310 receives the write selection signal WES and the read selection signal RES and receives the write address WADD and the read address RADD.

If both the write address WADD and the read address RADD are received, in step 420, it is determined whether the upper address of the write address WADD is identical to the upper address of the read address RADD.

The write address WADD and the read address RADD have information in their upper bits for designating the sub memory block. Therefore, if the write address WADD and the read address RADD are input, a sub memory block is designated by recognizing upper addresses of the write address WADD and the read address RADD.

If the upper address of the write address WADD and the upper address of the read address RADD are identical to each other, in step 430, it is determined whether the write address WADD and the read address RADD are identical to a predetermined cache memory address.

If the upper address of the write address WADD is identical to the upper address of the read address RADD, the write address WADD and the read address RADD designate the same sub memory block.

The tag memory control unit 310 stores a cache memory address therein. The cache memory address indicates an address of the sub memory block corresponding to the cache memory block CMB2. If the write address WADD is identical to the cache memory address, data has to be written in the cache memory block CMB2.

If neither the write address nor the read address is identical to the cache memory address, in step 440, data are read from the memory block corresponding to the read address and are written to the cache memory block. Step 440 will be described in more detail with reference to FIG. 5.

If neither the write address nor the read address is identical to the cache memory address, in step 510 it is determined whether data stored in the cache memory block is valid.

If neither the write address WADD nor the read address RADD is identical to the cache memory address, data has to be written to and read from the same sub memory block of the memory block MB2. A write word line and a read word line cannot be enabled in the same sub memory block at the same time. Thus, the cache memory block CMB2 is used for this reason.

If data stored in the cache memory block is not valid, in step 540, data is read from the memory block corresponding to the read address and written to the cache memory block.

If data has to be written to or read from the sub memory block, priority is given to a data read operation. Thus, data is read from the sub memory block of the memory block MB2 corresponding to the read address RADD. Since data stored in the cache memory block CMB2 is not valid, data is written to the cache memory block CMB2.

The tag memory control unit 310 applies a decoding control signal PCLS to the decoding unit 320. Then, a decoding circuit corresponding to the read address RADD of the decoding circuits in the decoding unit 320 decodes the corresponding sub memory block by generating the decoding signal DS. Data stored in the sub memory block is output. MDOUT of FIG. 3 denotes a path through which data stored in the memory block MB2 is output. Q denotes an output pin. The output pin Q and an input pin D are separated from each other.

The tag memory control unit 310 generates the cache control signal CCLS and writes data to the cache memory block CMB2.

Since data stored in the cache memory block CMB2 is updated, information on data written in the cache memory block CMB2 is updated in step 550. The update of the cached data information is performed by the tag memory control unit 310.

If data stored in the cache memory block CMB2 is valid, in step 520, data is read from the memory block corresponding to the read address, and the data stored in the cache memory block CMB2 is read and written to the corresponding memory block.

Since priority is given to a data read operation when data has to be both written to and read from the same sub memory block, data is read from the sub memory block of the memory block MB2 corresponding to the read address RADD in response to the decoding control signal DCLS generated from the tag memory control unit 310.

Since the data stored in the cache memory block CMB2 is valid, the data stored in the cache memory block CMB2 is read, and the read data is written in the sub memory block corresponding to the read data. Then, in step 530, data is written in the cache memory block CMB2 in response to the cache control signal CCLS, and information on the data written in the cache memory block CMB2 is updated. The update of the cache data information is performed by the tag memory control unit 310.

The data write and read operations are performed at the same time. That is, since data is written to the sub memory block and read from the cache memory block CMB2, the write word line and the read word line can be enabled at the same time. Therefore, the period of a clock signal can be reduced more than a conventional integrated circuit where the write word line and the read word line are sequentially enabled.

In step 445, it is determined whether only one of the write address and the read address is identical to the cache memory address, or both the write address and the read address are identical to the cache memory address, and then the data write and read operations are performed. Step 445 will be described in more detail with reference to FIG. 6.

If it is determined that only one of the write address and the read address is identical to the cache memory address, step 610 is performed. An operation according to the address that is identical to the cache memory address is performed on the cache memory block, and the other operation according to the other address that is not identical to the cache memory address is performed on the memory block.

That is, if the read address RADD is identical to the cache memory address, and the write address is not identical to the cache memory address, data is read from the cache memory block CMB2. The tag memory control unit 310 applies the cache control signal CCLS to the cache memory block CMB2 to perform the data read operation. The read data is denoted as CDOUT in FIG. 3.

The tag memory control unit 310 generates the decoding control signal DCLS to perform the data write operation on the memory block MB2.

If the write address is identical to the cache memory address and the read address RADD is not identical to the cache memory address, data is written to the cache memory block CMB2 and read from the memory block MB2.

If both the write address and the read address are identical to the cache memory address, in step 620, data is read from the cache memory block and written to the memory block, and information on the data written to the memory block is updated.

If both the write address and the read address are identical to the cache memory address, data has to be written to or read from the cache memory block CMB2. However, it is not possible to write data to or read data from the cache memory block CMB2 for the same reason why data cannot be written to or read from the sub memory block at the same time.

Therefore, data is read from the cache memory block CMB2 in response to the cache control signal CCLS and then written to the sub memory block corresponding to the write address in response to the decoding control signal DCLS. Since the data is supposed to be written to the cache memory block CMB2 but is written to the sub memory block, the data stored in the cache memory block CMB2 is not valid. Therefore, information on the data stored in the cache memory block CMB2 is updated by the tag memory control unit 310.

If the upper address of the write address and the upper address of the read address are not identical to each other in step 420, it is determined in step 450 whether the write address and the read address are identical to the cache memory address.

In step 455, it is determined whether either of the write address or the read address is identical to the cache memory address or if both the write address and the read address are identical to the cache memory address, and the data write and read operations are performed according to the determination. With reference to FIG. 7, step 455 will be described in more detail.

If only one of the write address and the read address is identical to the cache memory address, in step 710, an operation corresponding to an address that is identical to the cache memory address is performed on the cache memory block, and an operation corresponding to the other address that is not identical to the cache memory address is performed on the memory block.

That is, if the read address RADD is identical to the cache memory address and the write address WADD is not identical to the cache memory address, data is read from the cache memory block CMB2 in response to the cache control signal CCLS. In addition, the tag memory control unit 310 generates the decoding control signal DCLS to perform the data write operation on the memory block MB2.

If the write address WADD is identical to the cache memory address and the read address RADD is not identical to the cache memory address, data is written to the cache memory block CMB2 and read from the memory block MB2.

If both the write address WADD and the read address RADD are identical to the cache memory address, data is read from the cache memory block and written to the memory block, and information on the data written to the memory block is updated in step 720.

If both the write address and the read address are identical to the cache memory address, the data write and read operations have to be performed on the cache memory block CMB2. However, it is not possible to write data to or read data from the cache memory block CMB2 for the same reason as why data cannot be written to or read from the sub memory block at the same time.

Therefore, data is read from the cache memory block CMB2 in response to the cache control signal CCLS and then written to the sub memory block corresponding to the write address in response to the decoding control signal DCLS. Since the data is supposed to be written to the cache memory block CMB2 but is written to the sub memory block, the data stored in the cache memory block CMB2 is not valid. Therefore, information on the data stored in the cache memory block CMB2 is updated by the tag memory control unit 310.

If neither the write address nor the read address is identical to the cache memory address as a result of determination in step 450, in step 460, the data write and read operations are performed on two different sub memory blocks that respectively correspond to the write address and the read address of the memory block (step 460).

In this case, the write address and the read address RADD designate two different sub memory blocks. Since two different sub memory blocks are designated, the data read and write operations are performed by using decoding circuits (not shown) respectively corresponding to the sub memory blocks.

Since a separate decoding circuit used to decode the sub memory block is included and the write address decoding path and the read address decoding path are separate from each other, the data write and read operations can be performed at the same time to or from the sub memory blocks if the sub memory blocks of the memory block are different from each other.

If either of the write address or the read address is input in step 410, in step 465, it is determined whether the input address is identical to the cache memory address.

If the input address is identical to the cache memory address, in step 470, an operation corresponding to the input address is performed on the cache memory block. In this case, either the write address WADD or the read address RADD is input during a period of a clock signal.

If the input address is not identical to the cache memory address, an operation corresponding to the other address is performed on the memory block MB2.

That is, if the write address WADD is input and the input write address WADD is identical to the cache memory address, the data write operation is performed on cache memory block CMB2. If the read address RADD is input and the input read address RADD is identical to the cache memory address, the data read operation is performed on the cache memory block CMB2. Here, the tag memory control unit 310 generates the cache control signal CCLS to perform the data write or read operation on the cache memory block CMB2.

If the input address is not identical to the cache memory address, in step 475, an operation corresponding to the input address that is not identical to the cache memory address is performed on the memory block.

Figure 8:
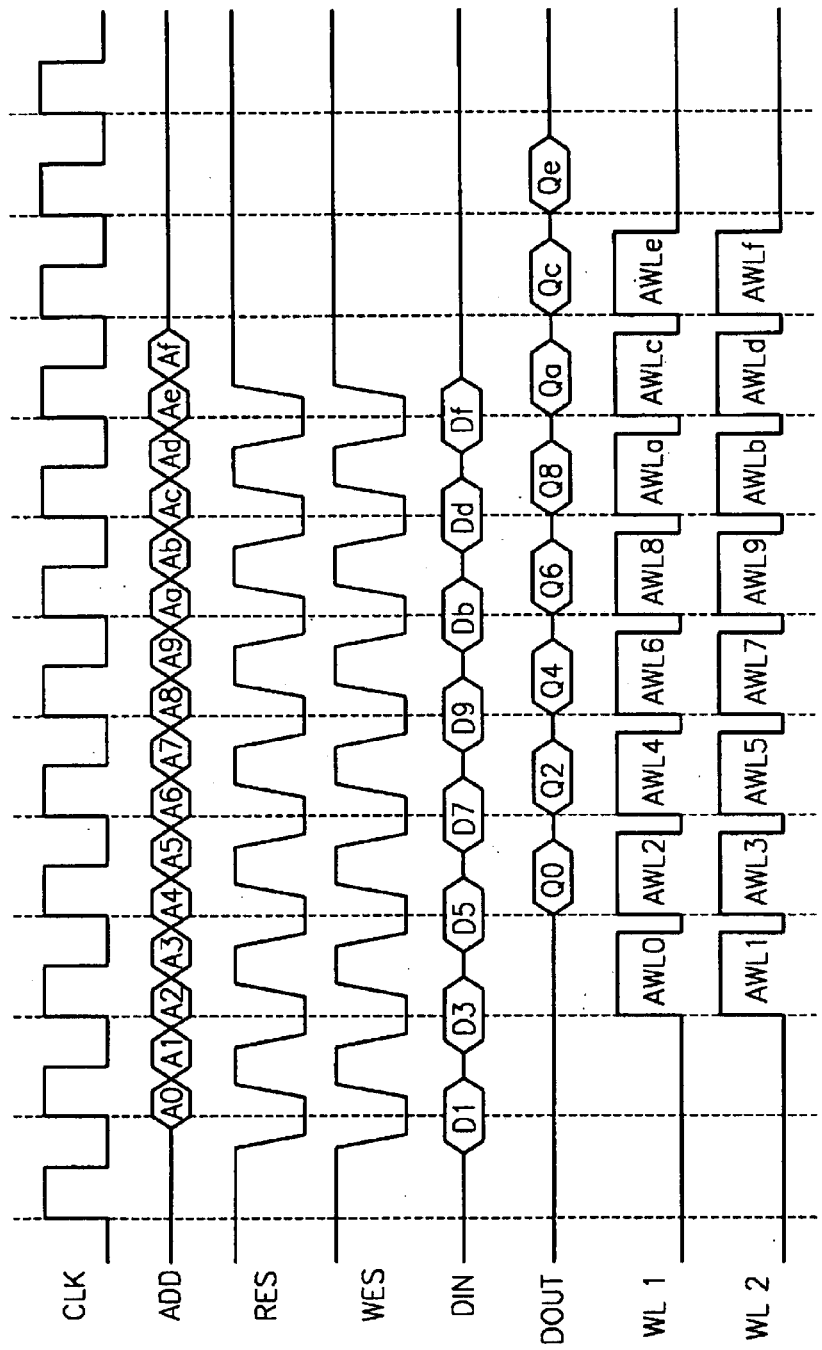
FIG. 8 is a timing diagram for explaining an operation of an integrated circuit according to the present invention.

FIG. 8 is a timing diagram for explaining an operation of an integrated circuit according to the present invention.

Referring to FIG. 8, the period of a clock signal CLK of FIG. 8 is half the period of the clock signal CLK of FIG. 1. That is, the frequency of the clock signal CLK of FIG. 8 is double that of the clock signal CLK of FIG. 1.

In the prior art, since a word line for the data write operation and a word line for the data read operation are sequentially enabled during a period of a clock signal CLK, it is difficult to shorten the period of the clock signal CLK. According to an integrated circuit and a method of reading and writing data at the same time according to the present invention, however, since a word line WL1 for the data read operation and a word line WL2 for the data write operation are enabled at the same time during a period of the clock signal CLK, it is possible to shorten the period of the clock signal CLK.

The present invention can be applied to an integrated circuit in which input and output ports are separated and capable of receiving both a write address and a read address during a period of a clock signal. According to the present invention, data can be input or output at a single data rate (SDR) or a double data rate (DDR) to and from an input pin and an output pin that are separated from each other.

As described above; the integrated circuit for reading and writing data at the same time divides the memory block into a plurality of sub memory blocks, additionally includes a decoding circuit that decodes each sub memory block, a write address decoding path, and a read address decoding path that are connected to all sub memory blocks, and reads data from or writes data to the memory block and the cache memory block at the same time during a period of a clock signal, thereby increasing the operational frequency of the clock signal.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An integrated circuit that has separate data input and output ports and to which a write address and a read address are input during a period of a clock signal, the integrated circuit comprising:

a plurality of memory blocks that each include a plurality of sub memory blocks;

a plurality of cache memory blocks that respectively correspond to the memory blocks; and a tag memory control unit that reads data from or writes data to the memory blocks and the cache memory blocks in response to the write address and the read address, wherein the tag memory control unit causes the integrated circuit to read data from a memory block and writes data to a cache memory block at the same time if an upper address of the read address and an upper address of the write address are identical to each other and reads data from a cache memory block and writes data to a memory block at the same time if an upper address of the read address and an upper address of the write address are identical to each other.

2. The integrated circuit of claim 1, wherein two different sub memory blocks respectively corresponding to the write address and the read address are decoded when the write address and the read address are different from each other.

3. The integrated circuit of claim 1, further comprising a write address decoding path and a read address decoding path that are separate from each other, the sub memory blocks connected to the write address decoding path and the read address decoding path.

4. The integrated circuit of claim 1, wherein, among the sub memory blocks in the memory block, memory cells in respective sub memory blocks having the same lower address correspond to the same memory cell of the cache memory block.

5. The integrated circuit of claim 1, wherein the size of the cache memory block is equal to or is larger than the size of each sub memory block.

6. The integrated circuit of claim 1, wherein the tag memory control unit stores validity determination information for each possible sub memory block lower address, which is used to determine whether the data stored in the cache memory block for that lower address is valid or not, and a cache memory address, which indicates an address of the sub memory block corresponding to the cache memory block for that lower address.

7. The integrated circuit of claim 6, wherein, when the upper address of the write address which selects one of the sub memory blocks is identical to the upper address of the read address which selects one of the sub memory blocks, the tag memory control unit causes the integrated circuit to read data from the sub memory block corresponding to the read address and write data to the cache memory block when neither the write address nor the read address is identical to their corresponding cache memory address and data are read or written at the same time.

8. The integrated circuit of claim 6, wherein the tag memory control unit when the upper address of the write address which selects one of the sub memory blocks is identical to the upper address of the read address when one of the write address and the read address is identical to their corresponding cache memory address, an operation corresponding to the address that is identical to the cache memory address is performed on the cache memory block and an operation corresponding to the address that is not identical to the cache memory address is performed on the memory block, and when both the write address and the read address are identical to their corresponding cache memory address, data is read from the cache memory block and written to the memory block and data are read or written at the same time.

9. The integrated circuit of claim 6, wherein the tag memory control unit, when the upper address of the write address which selects one of the sub memory blocks is not identical to the upper address of the read address, when one of the write address and the read address is identical to their corresponding cache memory address, an operation corresponding to the address that is identical to the cache memory address is performed on the cache memory block and an operation corresponding to the other address that is not identical to the cache memory address is performed on the memory block, and if both the write address and the read address are identical to their corresponding cache memory address, data is read from the cache memory block and then written to the memory block, and if neither the write address nor the read address are identical to their corresponding cache memory address, data is read from and written to two different sub memory blocks, which respectively correspond to the read address and the write address.

10. The integrated circuit of claim 1, wherein the data is input and output at a single data rate (SDR) or a double data rate (DDR).

11. An integrated circuit having separate data input and output ports, the integrated circuit comprising:
a plurality of memory blocks that each include a plurality of sub memory blocks; a plurality of cache memory blocks that respectively correspond to the memory blocks and to which data is read or written in response to a cache control signal;
a plurality of decoding units that respectively correspond to the memory blocks and generate decoding signals used to control the sub memory blocks in response to a write address, a read address, and a decoding control signal;
a tag memory control unit that receives a write selection signal or a read selection signal, receives the write address or the read address, and generates the cache control signal or the decoding control signal to read and write data based on comparisons of the write address and the read address.

12. The integrated circuit of claim 11, wherein the decoding units each include a plurality of decoding circuits that correspond respectively to the sub memory blocks.

13. The integrated circuit of claim 12, wherein the decoding circuits are connected to a write address decoding path and a read address decoding path that are separate from each other, and the sub memory blocks are respectively connected to the write address decoding path and the read address decoding path.

14. The integrated circuit of claim 11, wherein, when the write address and the read address are different from each other, two different sub memory blocks that respectively correspond to the write address and the read address are decoded.

15. The integrated circuit of claim 11, wherein, among the sub memory blocks in one memory block, memory cells in respective sub memory blocks having the same lower address correspond to the same memory cell of one cache memory block.

16. The integrated circuit of claim 11, wherein the size of a cache memory block is equal to or is larger than the size of each sub memory block.

17. The integrated circuit of claim 11, wherein the tag memory control unit stores validity determination information used to determine whether the data stored in the cache memory block are valid or not and a cache memory address, which indicates an address of a sub memory block corresponding to a cache memory block.

18. The integrated circuit of claim 17, wherein, when the upper address of the write address which selects one of the sub memory blocks is identical to the upper address of the read address which selects one of the sub memory blocks, the tag memory control unit causes the integrated circuit to read data from the sub memory block corresponding to the read address and write data to the cache memory block when neither the write address nor the read address is identical to the cache memory address, and data are read or written at the same time.

19. The integrated circuit of claim 17, wherein the tag memory control unit when the upper address of the write address that selects one of the sub memory blocks is identical to the upper address of the read address,
when one of the write address and the read address is identical to the cache memory address, the cache control signal is generated so that an operation corresponding to the address that is identical to the cache memory can be performed on the cache memory block and the decoding control signal is generated so that an operation corresponding to the other address that is not identical to the cache memory address can be performed on the memory block, and
both the write address and the read address are identical to the cache memory address, the cache control signal is generated to read data from the cache memory block and the decoding control signal is generated to write data to the memory block, and data are read or written at the same time.

20. The integrated circuit of claim 17, wherein the tag memory control unit, when the upper address of the write address that selects one of the sub memory blocks is not identical to the upper address of the read address,
when one of the write address and the read address is identical to the cache memory address, the cache control signal is generated so that an operation corresponding to the address that is identical to the cache memory address can be performed on the cache memory block and the decoding control signal is generated so that an operation corresponding to the other address that is not identical to the cache memory address can be performed on the memory block, and
when both the write address and the read address are identical to the cache memory address, the cache control signal is generated to read data from the cache memory block; the decoding control signal is generated to write the data to the memory block, and if neither the write address nor the read address are identical to the cache memory address, the decoding control signal is generated to read data from and write data to two different sub memory blocks that respectively correspond to the read address and the write address.

21. The integrated circuit of claim 11, wherein the data is input and output at either a single data rate (SDR) or a double data rate (DDR).

22. A method of reading and writing data in an integrated circuit that includes separate data input and output ports, a plurality of memory blocks each having a plurality of sub memory blocks, and a plurality of cache memory blocks corresponding respectively to the memory blocks, and to which a write address and a read address are input during a period of a clock signal, the method comprising:

(a) determining whether both the write address and the read address are input or one of the write address and the read address is input during a period of a clock signal;

(b) when both the write address and the read address are input, determining whether an upper address of the write address is identical to an upper address of the read address;

(c) when the upper address of the write address is identical to the upper address of the read address, determining whether at least one of the write address and the read address is identical to a cache memory address; and (d) when neither the write address nor the read address is identical to a cache memory address, data are read from a memory block corresponding to the read address and are written to the cache memory block.

23. The method of claim 22, wherein step (d) further comprises:

(d1) determining whether data stored in the cache memory block is valid;

(d2) reading data from the memory block corresponding to the read address and writing data to the cache memory block when data stored in the cache memory block is not valid;

(d3) updating information on the data written to the cache memory block;

(d4) when data stored in the cache memory block is valid, reading data from the memory block corresponding the read address and writing valid data stored in the cache memory block to the memory block; and (d5) writing data to the cache memory block and updating information on the data written to the cache memory block.

24. The method of claim 22, wherein the cache memory address indicates an address of a sub memory block corresponding to the cache memory block.

25. The method of claim 22, wherein step (c) further comprises:

(c1) when one of the write address and the read address is identical to the cache memory address, performing on the cache memory block an operation corresponding to an address that is identical to the cache memory address and performing on the memory block an operation corresponding to the other address that is not identical to the cache memory address; and (c2) when both the write address and the read address are identical to the cache memory address, reading data from the cache memory block, writing data to the memory block, and updating information on the data written to the memory block.

26. The method of claim 22, wherein step (b) further comprises:

(b1) when the upper address of the write address is not identical to the upper address of the read address, determining whether the write address and the read address are identical to the cache memory address;

(b2) when either the write address or the read address is identical to the cache memory address, performing on the cache memory block an operation corresponding to the address that is identical to the cache memory address and performing an operation on the memory block corresponding to the other address that is not identical to the cache memory address;

(b3) when both the write address and the read address are identical to the cache memory address, reading data from the cache memory block, writing data to the memory block, and updating information on the data written to the memory block; and (b4) when neither the write address nor the read address is identical to the cache memory address, performing a data write operation and a data read operation on two different sub memory blocks corresponding to the write address and the read address of the selected memory block.

27. The method of claim 22, wherein step (a) further comprises:

(a1) when only one of the write address or the read address is input, determining whether the input address is identical to the cache memory address;

(a2) when the input address is identical to the cache memory address, performing on the cache memory block an operation corresponding to the input address that is identical to the cache memory address; and (a3) when the input address is not identical to the cache memory address, performing on the memory block an operation corresponding to the input address that is not identical to the cache memory address.

28. The method of claim 22, wherein, among different sub memory blocks of the memory block, memory cells in respective sub memory blocks having the same lower address correspond to the same memory cell of the cache memory block.

29. The method of claim 22, wherein the size of the cache memory block is equal to or is larger than the size of each sub memory block.

30. The method of claim 22, wherein the data is input and output at either a single data rate (SDR) or a double data rate (DDR).

31. An integrated circuit comprising:

separate input and output data ports;

a memory block comprising a plurality of sub memory blocks;

a cache memory block large enough to store at least the same amount of data as a sub memory block; and a tag memory control unit that tags the valid entries of the cache memory block with a corresponding sub memory block address, and coordinates simultaneous read and write operations by using the cache memory block for at least one of the operations when the read and write operations address the same sub memory block.

32. A method of simultaneously performing read and write operations in an integrated circuit, the method comprising:

partitioning a memory block into a plurality of sub memory blocks;

maintaining a cache memory block large enough to store at least the same amount of data as a sub memory block;

tagging the valid entries in the cache memory block with a corresponding sub memory block address; and performing simultaneous read and write operations by using the cache memory block for one operation when both the read and write operations address the same memory block, and by performing simultaneous operations on different sub memory blocks when possible.

* * * * *

UNITED STATES PATENT AND TRADEMARK OFFICE
CERTIFICATE OF CORRECTION

PATENT NO. : 6,826,088 B2  Page 1 of 1
DATED : November 30, 2004
INVENTOR(S) : Sohn et al.

It is certified that error appears in the above-identified patent and that said Letters Patent is hereby corrected as shown below:

Column 3,
Line 62, replace "is valid (d2) reading" with -- is valid, (d2) reading --.
Line 65, replace "not valid (d3) updating" with -- not valid, (d3) updating --.
Line 67, replace "is valid" with -- is valid, --.

Column 3, line 67 to column 4, line 1,
Replace "reading-data" with -- reading data --.

Column 6,
Lines 9 and 10, replace "The cache memory" with -- ¶The cache memory --.

Signed and Sealed this

Seventh Day of February, 2006

JON W. DUDAS
*Director of the United States Patent and Trademark Office*